United States Patent
Alissa et al.

(10) Patent No.: US 11,533,829 B2
(45) Date of Patent: Dec. 20, 2022

(54) SYSTEMS AND METHODS FOR IMMERSION-COOLED DATACENTERS

(71) Applicant: Microsoft Technology Licensing, LLC, Redmond, WA (US)

(72) Inventors: Husam Atallah Alissa, Redmond, WA (US); Ioannis Manousakis, Redmond, WA (US); Nicholas Andrew Keehn, Kirkland, WA (US); Eric C. Peterson, Woodinville, WA (US); Bharath Ramakrishnan, Bellevue, WA (US); Christian L. Belady, Mercer Island, WA (US); Ricardo Gouvea Bianchini, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 8 days.

(21) Appl. No.: 17/227,203

(22) Filed: Apr. 9, 2021

(65) Prior Publication Data

US 2022/0330453 A1    Oct. 13, 2022

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/20* | (2006.01) | |

(52) U.S. Cl.
CPC ......... *H05K 7/208* (2013.01); *H05K 7/20836* (2013.01)

(58) Field of Classification Search
CPC ............... H05K 7/203; H05K 7/20327; H05K 7/20345; H05K 7/20309; H05K 7/20318; H05K 7/20336; H05K 5/0056; H05K 5/006; H05K 5/0052; H05K 5/0047
See application file for complete search history.

(56) References Cited

U.S. PATENT DOCUMENTS

| | | |
|---|---|---|
| 4,619,316 A | 10/1986 | Nakayama et al. |
| 4,694,378 A | 9/1987 | Nakayama et al. |
| 8,018,720 B2 | 9/2011 | Campbell et al. |

(Continued)

FOREIGN PATENT DOCUMENTS

| | | |
|---|---|---|
| CN | 110996610 A | 4/2020 |
| CN | 212138202 U | 12/2020 |

(Continued)

OTHER PUBLICATIONS

U.S. Appl. No. 17/227,208, filed Apr. 9, 2021.

(Continued)

*Primary Examiner* — Anthony M Haughton
(74) *Attorney, Agent, or Firm* — Ray Quinney & Nebeker P.C.; Paul N. Taylor

(57) ABSTRACT

A liquid-submersible thermal management system includes a shell, a heat-generating component, a working fluid, and at least one heat-dispersing element. The shell defines an immersion chamber where the heat-generating component is located in the immersion chamber. The working fluid is positioned in the immersion chamber and at least partially surrounds the heat-generating component so the working fluid receives heat from the heat-generating component. The at least one heat-dispersing element is positioned on exterior surface of the shell to conduct heat from the shell into the heat-dispersing element.

20 Claims, 4 Drawing Sheets

(56) References Cited

U.S. PATENT DOCUMENTS

| | | | |
|---|---|---|---|
| 8,720,011 B1* | 5/2014 | Hsu | E05D 3/122 |
| | | | 16/354 |
| 9,328,964 B2 | 5/2016 | Shelnutt et al. | |
| 9,562,380 B2* | 2/2017 | Song | E05D 1/00 |
| 9,606,583 B2* | 3/2017 | Ahn | G06F 1/1681 |
| 9,655,283 B2 | 5/2017 | James et al. | |
| 9,872,415 B2 | 1/2018 | Moss et al. | |
| 9,915,981 B2* | 3/2018 | Hsu | G06F 1/1652 |
| 9,921,622 B2 | 3/2018 | Shelnutt et al. | |
| 10,129,991 B2* | 11/2018 | Lin | E05D 3/18 |
| 10,244,650 B2 | 3/2019 | Laneryd et al. | |
| 10,477,726 B1 | 11/2019 | Enright et al. | |
| 10,512,192 B2 | 12/2019 | Miyoshi | |
| 2010/0326628 A1 | 12/2010 | Campbell et al. | |
| 2010/0328889 A1* | 12/2010 | Campbell | H05K 7/20809 |
| | | | 361/699 |
| 2014/0123436 A1* | 5/2014 | Griffin | G06F 1/1681 |
| | | | 16/221 |
| 2014/0216711 A1 | 8/2014 | Shelnutt et al. | |
| 2015/0144206 A1 | 5/2015 | Dickinson et al. | |
| 2016/0143191 A1 | 5/2016 | Smith | |
| 2016/0202736 A1* | 7/2016 | Huang | G06F 1/1681 |
| | | | 16/369 |
| 2016/0370828 A1* | 12/2016 | Hsu | G06F 1/1652 |
| 2016/0381840 A1 | 12/2016 | Peterson et al. | |
| 2017/0061836 A1* | 3/2017 | Kim | G06F 1/1626 |
| 2017/0064862 A1* | 3/2017 | Miyoshi | H01L 23/32 |
| 2017/0105313 A1 | 4/2017 | Shedd et al. | |
| 2017/0112017 A1 | 4/2017 | Wang | |
| 2017/0303443 A1 | 10/2017 | Inano et al. | |
| 2018/0153059 A1 | 5/2018 | Dehlsen et al. | |
| 2021/0007244 A1 | 1/2021 | Nizinkiewicz | |

FOREIGN PATENT DOCUMENTS

| | | |
|---|---|---|
| EP | 2988580 A1 | 2/2016 |
| WO | 2014039212 A1 | 3/2014 |

OTHER PUBLICATIONS

"Notice of Allowance Issued in U.S. Appl. No. 17/227,208", dated May 13, 2022, 9 Pages.

"International Search Repod and Written Opinion Issued in PCT Application No. PCT/US22/021231", dated Jun. 27, 2022, 11 Pages.

"International Search Repod and Written Opinion Issued in PCT Application No. PCT/US22/021070", dated Jul. 4, 2022, 13 Pages.

* cited by examiner

SYSTEMS AND METHODS FOR IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. The liquid working fluid can be maintained at a lower temperature by allowing vaporized fluid to rise out of the liquid. The vapor in the cooling liquid can adversely affect the cooling performance of the working fluid. The vapor can be condensed and returned to the immersion tank.

BRIEF SUMMARY

In some embodiments, a liquid-submersible thermal management system includes a shell, a heat-generating component, a working fluid, and at least one heat-dispersing element. The shell defines an immersion chamber where the heat-generating component is located in the immersion chamber. The working fluid is positioned in the immersion chamber and at least partially surrounds the heat-generating component, so the working fluid receives heat from the heat-generating component. The at least one heat-dispersing element is positioned on exterior surface of the shell to conduct heat from the shell into the heat-dispersing element.

In some embodiments, a liquid-submersible thermal management system includes a shell, a heat-generating component, a working fluid, and at least one heat-dispersing element. The shell defines an immersion chamber where the heat-generating component is located in the immersion chamber. The working fluid is positioned in the immersion chamber and at least partially surrounds the heat-generating component. A liquid phase of the working fluid receives heat from the heat-generating component, and a vapor phase of the working fluid is positioned in a headspace of the immersion chamber. The at least one heat-dispersing element is positioned on exterior surface of an upper portion of the shell to conduct heat from the shell into the heat-dispersing element.

In some embodiments, a liquid-submersible thermal management system includes a shell, a heat-generating component, a working fluid, and at least one heat-dispersing element. The shell defines an immersion chamber where the heat-generating component is located in the immersion chamber. The working fluid fills the immersion chamber and surrounds the heat-generating component, so the working fluid receives heat from the heat-generating component. The at least one heat-dispersing element is positioned on exterior surface of the shell to conduct heat from the shell into the heat-dispersing element.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components. Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the working fluid vaporizes, introducing vapor into the liquid of the working fluid.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion tank and a condenser to extract heat from the vapor of the working fluid. The condenser then condenses the vapor phase of the working fluid into a liquid phase and returns the liquid working fluid to the immersion chamber of the immersion tank. In some embodiments, the liquid working fluid absorbs heat from the heat-generating components, and one or more fluid conduits direct the hot liquid working fluid outside of the immersion chamber to a radiator or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system. An ambient liquid has a greater rate of convective transfer compared to a ambient gas, and therefore an immersion cooling system submerged in an ambient liquid may exhaust heat from the immersion cooling system more efficiently and/or without active cooling such as fans or pumps to move the ambient fluid over the immersion cooling system heat exchanger or heat-dispersing elements. In at least one embodiment, an immersion cooling system is submerged underwater, and heat is removed from the heat-generating components by the working fluid before the heat is transferred from the working fluid to the ambient water outside of the immersion cooling system.

Figure 1:
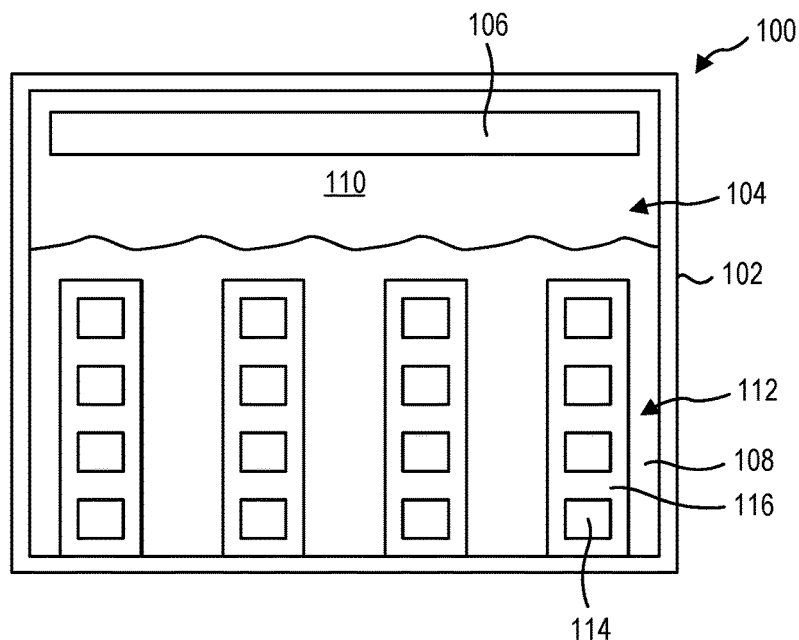
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
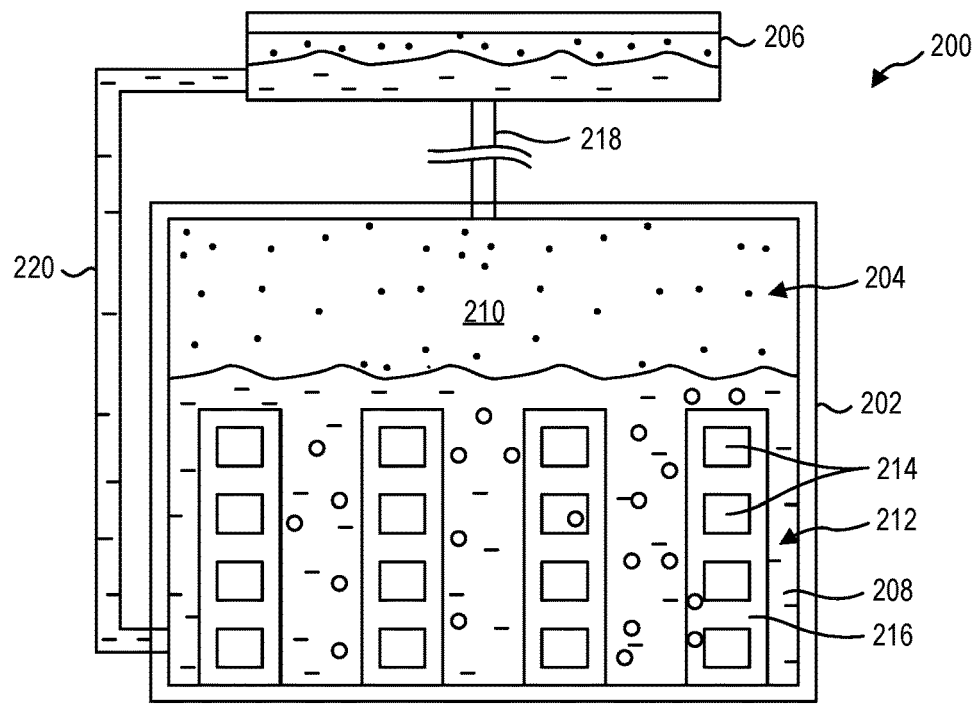
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

Figure 3:
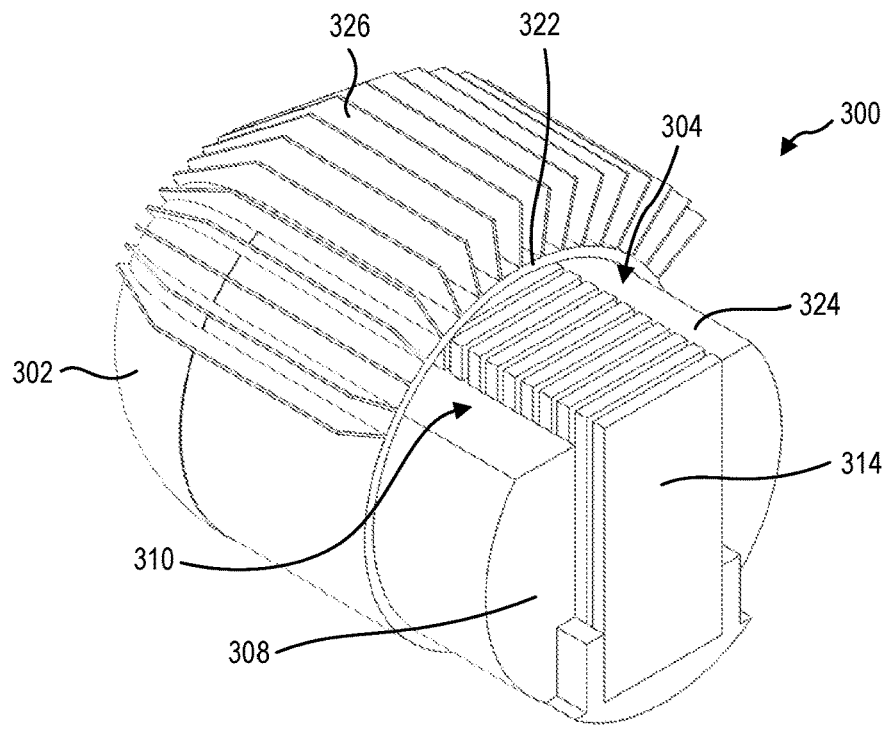
FIG. 3 is a perspective partial cross-sectional view of a two-phase immersion cooling system, according to at least one embodiment of the present disclosure.

In some examples, an immersion cooling system 200 includes an air-cooled condenser 206. An air-cooled condenser 206 may require fans or pumps to force ambient air over one or more heat pipes or fins to conduct heat from the condenser to the air. FIG. 3 is a perspective view of a partial cutaway of an immersion cooling system 300 according to some embodiments of the present disclosure. The immersion tank 302 defines an immersion chamber 304 and the immersion cooling system lacks a conventional condenser. In some embodiments according to the present disclosure, an immersion cooling system 300 cools the vapor using a cold shell 322 of the immersion tank 302. For example, and in contrast of a conventional system, the vapor working fluid 310 is not extracted from the immersion chamber 304 or immersion tank 302, but is rather condensed in the headspace 324, such that the condensed working fluid falls back into the immersion bath.

In some embodiments, the liquid working fluid 308 receives heat in a cooling volume of working fluid immediately surrounding the heat-generating components 314. The cooling volume is the region of the working fluid (including both liquid and vapor phases) that is immediately surrounding the heat-generating components 314 and is responsible for the convective cooling of the heat-generating components 314. In some embodiments, the cooling volume is the volume of working fluid within 5 millimeters (mm) of the heat-generating components 314.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

In some embodiments, the working fluid inside the immersion chamber is pressurized to provide a counteracting pressure against an ambient fluid around the shell 322. For example, when the immersion cooling system 300 is submerged underwater, the surrounding water applies a pressure to compress the shell 322. An interior pressure of the working fluid in the immersion cooling system 300 and/or shell 322 may be at least 1.25 atmospheres of pressure (e.g., 25% greater than standard atmospheric pressure at sea level). In other examples, the interior pressure of the working fluid in the immersion cooling system 300 and/or shell 322 may be at least 5.00 atmospheres of pressure.

In some embodiments, the heat-generating components 314 are positioned in the liquid working fluid 308 with at least a portion of the heat-generating components 314 protruding from the liquid working fluid 308 into the headspace 324. In some embodiments, the heat-generating components 314 are completely submerged in the liquid working fluid 308. While submerging the heat-generating components 314 may allow for efficiency thermal transfer to the liquid working fluid 308, the portion of the heat-generating components 314 that protrudes into the headspace 324 may allow for direct condensation and/or delivery of condensate on the heat-generating components 314.

The shell 322 is in contact with an ambient liquid around the immersion tank 302 that cools the shell 322. In some embodiments, one or more heat-dispersing elements 326 are positioned on or in contact with the shell 322 to increase the surface area of the shell 322 and/or conduct heat from the shell 322 into the heat-dispersing elements 326. In some embodiments, the heat-dispersing elements 326 are or include fins, heat-pipes, coils, pins, columns, rods, other structures to increase the surface-to-volume ratio of the shell 322, or combinations thereof. For example, FIG. 3 illustrates a plurality of fins positioned on an upper portion of the shell 322 to conduct heat from the shell 322 into the fins, which are surrounded by a colder ambient liquid, such as water.

In a particular example, an immersion cooling system submerged in surface seawater near Seattle, Wash., USA may be surrounded by ambient liquid that remains relatively constant at approximately 40° F. (4.5° C.) to 50° F. (10° C.) throughout the year. Ambient temperatures at depths below the surface (such as 50 meters) may be significantly lower, providing a greater thermal gradient to convectively cool the shell 322 and heat-dispersing elements 326 even faster. Due to the motion of the seawater and the thermal mass of the large amount of seawater around the immersion cooling system 300, the temperature of the ambient liquid may remain substantially unchanged by the waste heat from the immersion cooling system 300.

Figure 4:
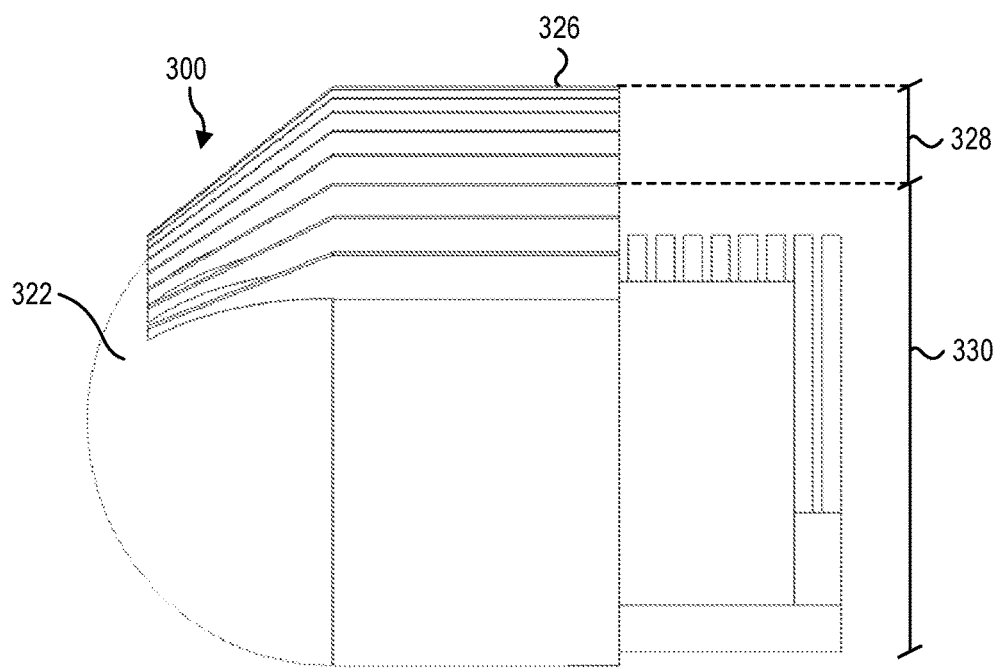
FIG. 4 is a side partial cross-sectional view of the immersion cooling system of FIG. 3, according to at least one embodiment of the present disclosure.

FIG. 4 is a side view of the partial cross-section of the immersion cooling system 300 of FIG. 3. In some embodiments, the heat-dispersing elements 326 extend a height 328 above the shell 322 of the immersion cooling system 300. In some embodiments, the height 328 of the heat-dispersing elements 326 is relative to a diameter 330 of the shell 322. For example, the height 328 may be a percentage of the diameter 330 in a range having an upper value, a lower value, or upper and lower value including any of 5%, 10%, 15%, 20%, 25%, 30%, or any values therebetween. In some examples, the height 328 is greater than 5% of the diameter 330. In some examples, the height 328 is less than 30% of the diameter 330. In some examples, the height 328 is between 5% and 30% of the diameter 330. In some examples, such as that illustrated in FIG. 4, the height 328 is approximately 20% of the diameter 330.

The height 328 of the heat-dispersing elements 326, the quantity of the heat-dispersing elements 326, and the thickness of the heat-dispersing elements 326 may each contribute to dispersing heat from the working fluid through the shell 322. For example, increasing the height 328 of the heat-dispersing elements 326 may increase the surface area of each of the heat-dispersing elements 326, which increases the convective cooling possible between the heat-dispersing elements 326 and the ambient fluid. In another example, increasing the quantity of the heat-dispersing elements 326 increases the total surface area of the heat-dispersing elements 326. Increasing the thickness of each of the heat-dispersing elements 326 may increase the thermal mass of the heat-dispersing elements 326, allowing the heat-dispersing elements 326 themselves to act as a heatsink for the working fluid and/or the shell 322.

In some embodiments, the shell 322 may promote transfer of heat through the upper portion of the shell 322 proximate the headspace 324 by having a thinner shell thickness proximate the upper portion than proximate a lower portion. For example, the shell thickness proximate the headspace 324 may be at least 10% thinner than the shell thickness proximate the bottom of the shell 322. In another example, the shell thickness proximate the headspace 324 may be at least 20% thinner than the shell thickness proximate the bottom of the shell 322. In yet another example, the shell thickness proximate the headspace 324 may be at least 30% thinner than the shell thickness proximate the bottom of the shell 322.

Figure 5:
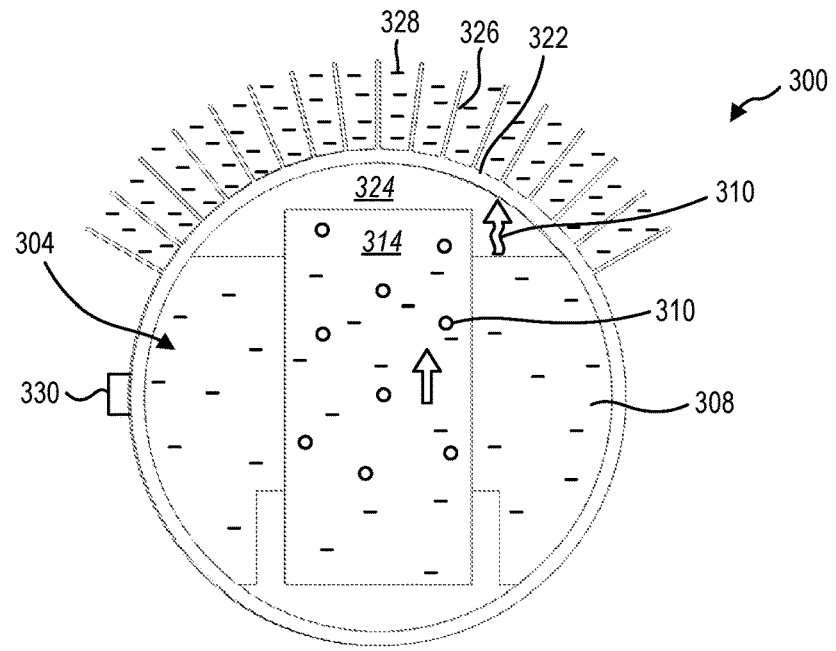
FIG. 5 is an end cross-sectional view of the immersion cooling system of FIG. 3, according to at least one embodiment of the present disclosure.

FIG. 5 is an end view of the partial cross-section of FIG. 3 and FIG. 4. The heat-generating components 314 positioned in the immersion chamber 304 heat the liquid working fluid 308 to a boiling temperature. The liquid working fluid 308 vaporizes and bubbles of the vapor working fluid 310 rise out of the liquid working fluid 308. The hot vapor working fluid 310 continues to rise through the headspace 324 of the immersion chamber 304 and to the upper portion of the shell 322.

In some embodiments, the heat from the hot vapor working fluid 310 is transferred to the shell 322 through convective cooling, and the shell 322 conducts the heat into the heat-dispersing elements 326. In some embodiments, the heat-dispersing elements 326 are integrally formed with the shell 322 (e.g., cast together), such that the material is continuous and/or there is no thermal interface between the shell 322 and the heat-dispersing elements 326. In some embodiments, the heat-dispersing elements 326 are welded or otherwise bonded to the shell 322. For example, the heat-dispersing elements 326 may be a copper nickel alloy that is welded to a steel shell 322. In some embodiments, the heat-dispersing elements 326 are mechanically fixed to the shell 322. For example, the heat-dispersing elements 326 may be individual or groups of fins or other heat-dispersing elements 326 that are each affixed to the shell 322 with bolts, screws, threaded rods, clips, clamps, rivets, or other mechanical fasteners. In such examples, a thermal interface may exist between the non-integrally formed components, reducing efficiency. However, the simplicity of repair and/or customization of the heat-dispersing elements 326 on the shell 322 may be desirable.

Immersion cooling systems according to the present disclosure may include a variety of sensors to monitor the flowrate, pressure, temperature, density, or other properties and/or parameters of the immersion cooling system and/or working fluid. For example, sensors may be positioned at or in the immersion tank, the hot fluid conduit, the subcooled return line, the heat exchanger, other components of the immersion cooling system, or combinations thereof. In some embodiments, the immersion cooling system includes a plurality of at least one type of sensor to monitor changes to that property within the immersion cooling system. For example, an immersion cooling system according to the present disclosure may include temperature sensors at a plurality of locations in or on the immersion cooling system to monitor temperature gradients and cooling efficiency in the immersion cooling system.

In some embodiments, the immersion cooling system 300 includes a fan, pump, jet, or other fluid motive device to urge the ambient fluid 329 across the outer surface of the shell and/or the heat-dispersing elements 326. For example, a fan may be positioned at a first longitudinal end of the shell 322 to force fluid flow along the shell 322 in the longitudinal direction. In other examples, a jet or pump 333 is located in or between the heat-dispersing elements 326 to force ambient fluid past the heat-dispersing elements 326 to increase convective cooling of the shell 322 and/or heat-dispersing elements 326.

When the immersion cooling system 300 is submerged in a natural body of water, the immersion cooling system 300 may take advantage of naturally occurring fluid flow over the shell 322 and/or heat-dispersing elements 326. For example, when the immersion cooling system 300 is submerged in a river, the current of the river may ensure a constant flow of ambient fluid 329 across the shell 322 and/or heat-dispersing elements 326. In other examples, when the immersion cooling system 300 is submerged in the ocean, currents and/or tidal forces acting on the local area of the ocean may ensure a constant motion of the ambient fluid 329 across the shell 322 and/or heat-dispersing elements 326.

When submerged in fresh water or salt water, the exterior of the immersion cooling system 300 (e.g., the shell 322 and/or heat-dispersing elements 326) may experience or be exposed to corrosion from the ambient fluid 329. In some embodiments, the exterior surface of the shell 322 and/or heat-dispersing elements 326 is made of or includes a corrosion resistant material. For example, the shell 322 and/or heat-dispersing elements 326 have a corrosion resistant coating, such as a copper nickel coating. In other examples, the shell 322 and/or heat-dispersing elements 326 are made of a corrosion resistant material, such as stainless steel.

In some embodiments, the shell 322 and/or heat-dispersing elements 326 has an electrical potential applied thereto with a sacrificial anode 331 electrically coupled to the shell 322 and/or heat-dispersing elements 326. The sacrificial anode 331 may be coupled directly to the shell 322 and/or heat-dispersing elements 326, or the sacrificial anode 331 may be electrically coupled to the shell 322 and/or heat-dispersing elements 326 through a wire or other electrical conduit connecting the sacrificial anode 331 and the shell 322 and/or heat-dispersing elements 326. In some embodiments, the corrosion resistant materials and/or sacrificial anode 331 of the immersion cooling system 300 can allow the immersion cooling system 300 to remain submerged in an ambient fluid 329 that may, otherwise, corrode at least a portion of the shell 322 and/or heat-dispersing elements 326.

Figure 6:
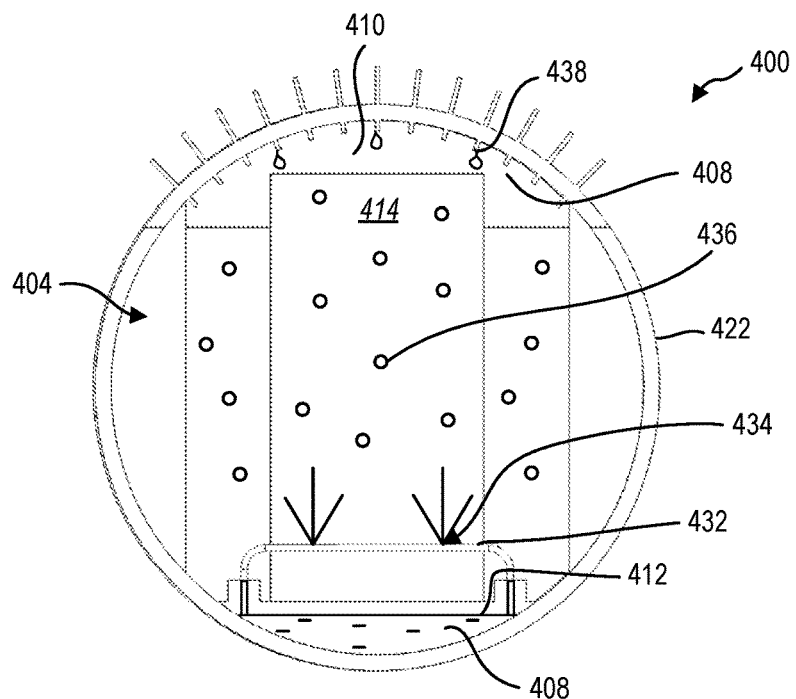
FIG. 6 is an end partial cross-sectional view of an immersion cooling system with spray nozzles, according to at least one embodiment of the present disclosure.

FIG. 6 is an end cross-sectional view of another embodiment of an immersion cooling system 400 according to the present disclosure. In some embodiments, at least a portion of the heat-generating components 414 in the immersion cooling system 400 protrude above the immersion bath 412 of liquid working fluid 408. Cooling of the heat-generating components 414 may be assisted by the spraying of liquid working fluid 408 toward and/or above the heat-generating components 414. In some embodiments, a fluid conduit 432 carries liquid working fluid 408 from the immersion bath 412 or other reservoir of liquid working fluid 408 to at least one nozzle 434. The liquid working fluid 408 is ejected from the nozzle(s) 434 in droplets 436 in the immersion chamber 404.

In some embodiments, the nozzle 434 is positioned below the heat-generating component 414 and the droplets 436 are sprayed upward toward the heat-generating component 414. In some embodiments, the nozzle 434 is positioned above the heat-generating component 414 and the droplets 436 are sprayed downward toward the heat-generating component 414. In some embodiments, the nozzle 434 is positioned laterally from the heat-generating component 414 and the droplets 436 are sprayed laterally toward the heat-generating component 414.

The nozzles 434 may be configured and/or sized to produce droplets 436 of a desired diameter. The nozzles 434 may be adjustable to vary the size of the droplets 436 depending upon desired flowrate through the nozzles 434 and the desired droplet size. In some embodiments, the spray nozzles 434 create a plurality of droplets 436 with an average droplet diameter of less than 1 millimeter. In some embodiments, the nozzles 434 create a plurality of droplets 436 with an average droplet diameter of less than 0.5 millimeters. In some embodiments, the nozzles 434 create a plurality of droplets 436 with an average droplet diameter of less than 0.25 millimeters. In some embodiments, the nozzles 434 create a plurality of droplets 436 with an average droplet diameter of less than 0.1 millimeters. In some embodiments, the nozzles 434 sprays the subcooled working fluid onto another component, such as a fan, which further disrupts the surface tension and creates the droplets 436 and/or more droplets.

While some embodiments of immersion cooling systems are described herein with liquid working fluid condensed on the interior surface of the shell to return to the immersion bath or other reservoir, some embodiments such as the immersion cooling system 400 illustrated in FIG. 6 include one or more interior surface features 438 positioned on an interior surface of the shell 422. The interior surface features 438 may be or include fins, pins, rods, protrusions, ridges, or other features that create surface relief. In some embodiments, the interior surface features 438 increase the surface area of the upper portion of the shell 422, allowing greater and/or more efficient thermal transfer between the vapor working fluid 410 and the shell 422.

The interior surface features 438 allow the condensate of the vapor working fluid 410 to drip down through the immersion chamber 404 in a distributed manner. For example, condensed liquid working fluid 408 on a smooth interior surface of the shell 422 may simply remain in contact with the interior surface and run along the interior surface to the bottom of the immersion chamber 404. The interior surface features 438 may promote a more distributed dripping of the liquid working fluid 408 through the interior of the shell 422, directly cooling any heat-generating components 414 upon which the liquid working fluid 408 falls, as well as providing a condensation surface upon which vapor working fluid 410 may condense in the immersion chamber 404.

In some embodiments, the interior surface of the shell 422 and/or the surface of the interior surface features 438 have a condensation texture thereon to further promote condensation of the vapor working fluid 410 on the surfaces. The condensation texture may include dimples, recesses, scoring, striations, scratches, or other uneven surface textures. The uneven surface of the condensation texture may allow for nucleation sites which may reduce the initial energy required to promote condensation from the vapor phase to the liquid phase.

Figure 7:
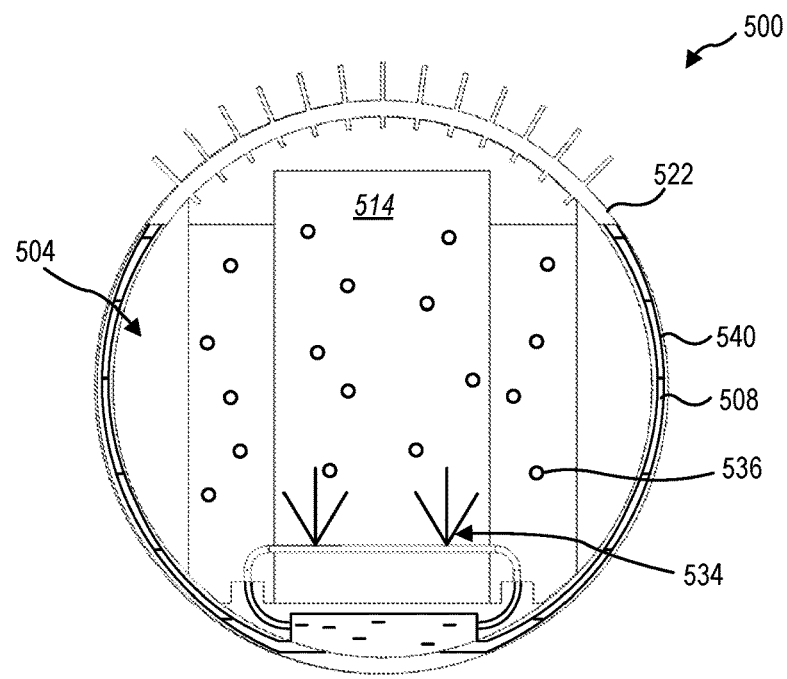
FIG. 7 is an end partial cross-sectional view of an immersion cooling system with fluid conduits in the shell, according to at least one embodiment of the present disclosure.

FIG. 7 is an end cross-sectional view of another embodiment of an immersion cooling system 500. In some embodiments, the shell 522 includes one or more shell channels or conduits 540 positioned in or on the shell 522 to guide condensed liquid working fluid 508 back down the shell 522. In some embodiments, the shell conduits 540 are embedded within the walls of the shell 522, such that part of the shell 522 separates the shell conduit 540 from the immersion chamber 504 and another part of the shell 522 separates the shell conduit 540 from the exterior of the shell 522 and the ambient fluid outside the shell 522. In at least one embodiment, the shell 522 includes an inner wall and an outer wall that define at least one shell conduit 540 therebetween. However, the shell conduit 540 may be subcooled by the ambient fluid. The liquid working fluid 508 may be subcooled while traveling through the shell conduit 540, such that the droplets 536 that is sprayed from the nozzle(s) 534 may cool the heat-generating components 514 more efficiently.

Immersion cooling systems according to the present disclosure may use the cooling capacity of the surrounding ambient fluid to exhaust heat from the working fluid through the shell. In some embodiments, the immersion cooling system employs a two-phase working fluid that transitions between a liquid phase and a vapor phase to transfer heat from the heat-generating components to the ambient fluid. In some embodiments, the immersion cooling system, such as illustrated in FIG. 8, employs a single-phase working fluid that remains in a single phase while transporting heat from the heat-generating components to the ambient fluid around the immersion cooling system.

Figure 8:
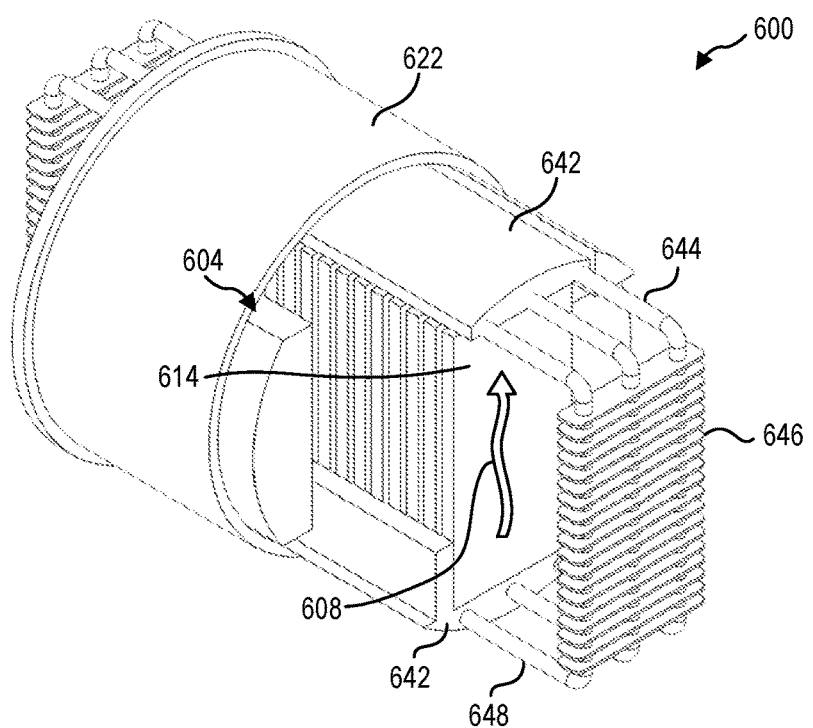
FIG. 8 is a perspective partial cross-sectional view of a single-phase immersion cooling system, according to at least one embodiment of the present disclosure.

FIG. 8 is a perspective partial cross-sectional view of an immersion cooling system 600. The immersion cooling system 600 includes a liquid working fluid 608 that receives heat from one or more heat-generating components 614. The liquid working fluid 608 absorbs the heat and does not change physical states as the liquid working fluid 608 flows through the shell 622 between manifolds 642. In some embodiments, a portion of the heat is transferred from the liquid working fluid 608 to the shell 622, which, in turn, exhausts the heat to an exterior of the shell 622.

In some embodiments, a manifold 642 directs the hot liquid working fluid 608 into a first fluid conduit 644. The first fluid conduit 644 carries the hot liquid working fluid 608 to a heat exchanger 646 positioned outside of the shell 622. The external heat exchanger 646 is positioned in contact with the ambient fluid to exhaust heat into the ambient fluid and cool the liquid working fluid 608 in the heat exchanger 646 before returning the liquid working fluid 608 through the second fluid conduit 648. In some embodiments, the second fluid conduit 648 connects to another manifold 642 that distributes the cooled liquid working fluid 608 through the immersion chamber 604 to evenly cool the heat-generating components 614.

INDUSTRIAL APPLICABILITY

The present disclosure relates generally to systems and methods for thermal management of electronic devices or other heat-generating components. Immersion chambers surround or partially surround the heat-generating components in a liquid working fluid, which conducts heat from the heat-generating components to cool the heat-generating components. As the working fluid absorbs heat from the heat-generating components, the temperature of the working fluid increases and the working fluid may vaporize, introducing vapor into the liquid of the working fluid. The vapor will rise due to buoyancy in the opposite direction of gravity, accumulating in a headspace of the immersion chamber above the immersion bath of liquid working fluid.

An immersion cooling system according to the present disclosure includes an immersion chamber with a working fluid positioned therein. The working fluid transitions between a liquid phase and a vapor phase to remove heat from hot or heat-generating components in the chamber. The liquid phase more efficiency receives heat from the components and, upon transition to the vapor phase, the working fluid can be cooled and condensed to extract the heat from the working fluid before the working fluid is returned to the liquid immersion bath at a lower temperature.

In some embodiments, the immersion bath of the liquid working fluid has a plurality of heat-generating components positioned in the liquid working fluid. The liquid working fluid surrounds the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the working fluid may remove heat through convective cooling. In some embodiments, one or more of the heat-generating components includes a heat sink or other device attached to the heat-generating component to conduct away thermal energy and effectively increase the surface area of the heat-generating component.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor rises in the liquid working fluid, the vapor phase of the working fluid accumulates in an upper vapor region of the chamber. Conventionally, a condenser cools part of the vapor of the working fluid back into a liquid phase, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In some embodiments, the immersion tank defines an immersion chamber and the immersion cooling system lacks a conventional condenser. In some embodiments according to the present disclosure, an immersion cooling system cools the vapor using a cold shell of the immersion tank. For example, and in contrast of a conventional system, the vapor working fluid is not extracted from the immersion chamber or immersion tank, but rather condensed in the headspace, such that the condensed working fluid falls back into the immersion bath.

In some embodiments, the heat-generating components are positioned in the liquid working fluid with at least a portion of the heat-generating components protruding from the liquid working fluid into the headspace. In some embodiments, the heat-generating components are completely submerged in the liquid working fluid. While submerging the heat-generating components may allow for efficiency thermal transfer to the liquid working fluid, the portion of the heat-generating components that protrudes into the headspace may allow for direct condensation and/or delivery of condensate on the heat-generating components.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

In some embodiments, the working fluid inside the immersion chamber is pressurized to provide a counteracting pressure against an ambient fluid around the shell. For example, when the immersion cooling system is submerged underwater, the surrounding water applies a pressure to compress the shell. An interior pressure of the working fluid in the immersion cooling system and/or shell may be at least 1.25 atmospheres of pressure (e.g., 25% greater than standard atmospheric pressure at sea level). In other examples, the interior pressure of the working fluid in the immersion cooling system and/or shell may be at least 5.00 atmospheres of pressure.

The shell is in contact with an ambient liquid around the immersion tank that cools the shell. In some embodiments, one or more heat-dispersing elements are positioned on or in contact with the shell to increase the surface area of the shell and/or conduct heat from the shell into the heat-dispersing elements. In some embodiments, the heat-dispersing elements are or include fins, heat-pipes, coils, pins, columns, rods, other structures to increase the surface-to-volume ratio of the shell, or combinations thereof. For example, a plurality of fins may be positioned on an upper portion of the shell to conduct heat from the shell into the fins, which are surrounded by a colder ambient liquid, such as water.

In a particular example, an immersion cooling system submerged in surface seawater near Seattle, Wash., USA may be surrounded by ambient liquid that remains relatively constant at approximately 40° F. (4.5° C.) to 50° F. (10° C.) throughout the year. Ambient temperatures at depths below the surface (such as 50 meters) may be significantly lower, providing a greater thermal gradient to convectively cool the shell and heat-dispersing elements even faster. Due to the motion of the seawater and the thermal mass of the large amount of seawater around the immersion cooling system, the temperature of the ambient liquid may remain substantially unchanged by the waste heat from the immersion cooling system.

In some embodiments, the heat-dispersing elements extend a height above the shell of the immersion cooling system. In some embodiments, the height of the heat-dispersing elements is relative to a diameter of the shell. For example, the height may be a percentage of the diameter in a range having an upper value, a lower value, or upper and lower value including any of 5%, 10%, 15%, 20%, 25%, 30%, or any values therebetween. In some examples, the height is greater than 5% of the diameter. In some examples, the height is less than 30% of the diameter. In some examples, the height is between 5% and 30% of the diameter. In some examples, the height is approximately 20% of the diameter.

The height of the heat-dispersing elements, the quantity of the heat-dispersing elements, and the thickness of the heat-dispersing elements may each contribute to dispersing heat from the working fluid through the shell. For example, increasing the height of the heat-dispersing elements may increase the surface area of each of the heat-dispersing elements, which increases the convective cooling possible between the heat-dispersing elements and the ambient fluid. In another example, increasing the quantity of the heat-dispersing elements increases the total surface area of the heat-dispersing elements. Increasing the thickness of each of the heat-dispersing elements may increase the thermal mass of the heat-dispersing elements, allowing the heat-dispersing elements themselves to act as a heatsink for the working fluid and/or the shell.

In some embodiments, the shell may promote transfer of heat through the upper portion of the shell proximate the headspace by having a thinner shell thickness proximate the upper portion than proximate a lower portion. For example, the shell thickness proximate the headspace may be at least 10% thinner than the shell thickness proximate the bottom of the shell. In another example, the shell thickness proximate the headspace may be at least 20% thinner than the shell thickness proximate the bottom of the shell. In yet another example, the shell thickness proximate the headspace may be at least 30% thinner than the shell thickness proximate the bottom of the shell.

The heat-generating components positioned in the immersion chamber heat the liquid working fluid to a boiling temperature. The liquid working fluid vaporizes and bubbles of the vapor working fluid rise out of the liquid working fluid. The hot vapor working fluid continues to rise through the headspace of the immersion chamber and to the upper portion of the shell.

In some embodiments, the heat from the hot vapor working fluid is transferred to the shell through convective cooling, and the shell conducts the heat into the heat-dispersing elements. In some embodiments, the heat-dispersing elements are integrally formed with the shell (e.g., cast together), such that the material is continuous and/or there is no thermal interface between the shell and the heat-dispersing elements. In some embodiments, the heat-dispersing elements are welded or otherwise bonded to the shell. For example, the heat-dispersing elements may be a copper nickel alloy that is welded to a steel shell. In some embodiments, the heat-dispersing elements are mechanically fixed to the shell. For example, the heat-dispersing elements may be individual or groups of fins or other heat-dispersing elements that are each affixed to the shell with bolts, screws, threaded rods, clips, clamps, rivets, or other mechanical fasteners. In such examples, a thermal interface may exist between the non-integrally formed components, reducing efficiency. However, the simplicity of repair and/or customization of the heat-dispersing elements on the shell may be desirable.

Immersion cooling systems according to the present disclosure may include a variety of sensors to monitor the flowrate, pressure, temperature, density, or other properties and/or parameters of the immersion cooling system and/or working fluid. For example, sensors may be positioned at or in the immersion tank, the hot fluid conduit, the subcooled return line, the heat exchanger, other components of the immersion cooling system, or combinations thereof. In some embodiments, the immersion cooling system includes a plurality of at least one type of sensor to monitor changes to that property within the immersion cooling system. For example, an immersion cooling system according to the present disclosure may include temperature sensors at a plurality of locations in or on the immersion cooling system to monitor temperature gradients and cooling efficiency in the immersion cooling system.

In some embodiments, the immersion cooling system includes a fan, pump, jet, or other fluid motive device to urge the ambient fluid across the outer surface of the shell and/or the heat-dispersing elements. For example, a fan may be positioned at a first longitudinal end of the shell to force fluid flow along the shell in the longitudinal direction. In other examples, a jet or pump is located in or between the heat-dispersing elements to force ambient fluid past the heat-dispersing elements to increase convective cooling of the shell and/or heat-dispersing elements.

When the immersion cooling system is submerged in a natural body of water, the immersion cooling system may take advantage of naturally occurring fluid flow over the shell and/or heat-dispersing elements. For example, when the immersion cooling system is submerged in a river, the current of the river may ensure a constant flow of ambient fluid across the shell and/or heat-dispersing elements. In other examples, when the immersion cooling system is submerged in the ocean, currents and/or tidal forces acting on the local area of the ocean may ensure a constant motion of the ambient fluid across the shell and/or heat-dispersing elements.

When submerged in fresh water or salt water, the exterior of the immersion cooling system (e.g., the shell and/or heat-dispersing elements) may experience or be exposed to corrosion from the ambient fluid. In some embodiments, the exterior surface of the shell and/or heat-dispersing elements is made of or includes a corrosion resistant material. For example, the shell and/or heat-dispersing elements have a corrosion resistant coating, such as a copper nickel coating. In other examples, the shell and/or heat-dispersing elements are made of a corrosion resistant material, such as stainless steel.

In some embodiments, the shell and/or heat-dispersing elements has an electrical potential applied thereto with a sacrificial anode electrically coupled to the shell and/or heat-dispersing elements. The sacrificial anode may be coupled directly to the shell and/or heat-dispersing elements, or the sacrificial anode may be electrically coupled to the shell and/or heat-dispersing elements through a wire or other electrical conduit connecting the sacrificial anode and the shell and/or heat-dispersing elements. In some embodiments, the corrosion resistant materials and/or sacrificial anode of the immersion cooling system can allow the immersion cooling system to remain submerged in an ambient fluid that may, otherwise, corrode at least a portion of the shell and/or heat-dispersing elements.

In some embodiments, at least a portion of the heat-generating components in the immersion cooling system protrude above the immersion bath of liquid working fluid. Cooling of the heat-generating components may be assisted by the spraying of liquid working fluid toward and/or above the heat-generating components. In some embodiments, a fluid conduit carries liquid working fluid from the immersion bath or other reservoir of liquid working fluid to at least one nozzle. The liquid working fluid is ejected from the nozzle(s) in droplets in the immersion chamber.

In some embodiments, the nozzle is positioned below the heat-generating component and the droplets are sprayed upward toward the heat-generating component. In some embodiments, the nozzle is positioned above the heat-generating component and the droplets are sprayed downward toward the heat-generating component. In some embodiments, the nozzle is positioned laterally from the heat-generating component and the droplets are sprayed laterally toward the heat-generating component.

The nozzles may be configured and/or sized to produce droplets of a desired diameter. The nozzles may be adjustable to vary the size of the droplets depending upon desired flowrate through the nozzles and the desired droplet size. In some embodiments, the nozzles create a plurality of droplets with an average droplet diameter of less than 1 millimeter. In some embodiments, the nozzles create a plurality of droplets with an average droplet diameter of less than 0.5 millimeters. In some embodiments, the nozzles create a plurality of droplets with an average droplet diameter of less than 0.25 millimeters. In some embodiments, the nozzles create a plurality of droplets with an average droplet diameter of less than 0.1 millimeters. In some embodiments, the nozzles sprays the subcooled working fluid onto another component, such as a fan, which further disrupts the surface tension and creates the droplets and/or more droplets.

While some embodiments of immersion cooling systems are described herein with liquid working fluid condensed on the interior surface of the shell to return to the immersion bath or other reservoir, some embodiments include one or more interior surface features positioned on an interior surface of the shell. The interior surface features may be or include fins, pins, rods, protrusions, ridges, or other features that create surface relief. In some embodiments, the interior surface features increase the surface area of the upper portion of the shell, allowing greater and/or more efficient thermal transfer between the vapor working fluid and the shell.

The interior surface features allow the condensate of the vapor working fluid to drip down through the immersion chamber in a distributed manner or in a predetermined pattern. For example, condensed liquid working fluid on a smooth interior surface of the shell may simply remain in contact with the interior surface and run along the interior surface to the bottom of the immersion chamber. The interior surface features may promote a more distributed or controlled dripping of the liquid working fluid through the interior of the shell, directly cooling any heat-generating components upon which the liquid working fluid falls, as well as providing a condensation surface upon which vapor working fluid may condense in the immersion chamber.

In some embodiments, the interior surface of the shell and/or the surface of the interior surface features have a condensation texture thereon to further promote condensation of the vapor working fluid on the surfaces. The condensation texture may include dimples, recesses, scoring, striations, scratches, or other uneven surface textures. The uneven surface of the condensation texture may allow for nucleation sites which may reduce the initial energy required to promote condensation from the vapor phase to the liquid phase.

In some embodiments, the shell includes one or more shell channels or conduits positioned in or on the shell to guide condensed liquid working fluid back down the shell. In some embodiments, the shell conduits are embedded within the walls of the shell, such that part of the shell separates the shell conduit from the immersion chamber and another part of the shell separates the shell conduit from the exterior of the shell and the ambient fluid outside the shell. In at least one embodiment, the shell includes an inner wall and an outer wall that define at least one shell conduit therebetween. However, the shell conduit may be subcooled by the ambient fluid. The liquid working fluid may be subcooled while traveling through the shell conduit, such that the liquid working fluid that is sprayed from the nozzle(s) may cool the heat-generating components more efficiently.

Immersion cooling systems according to the present disclosure may use the cooling capacity of the surrounding ambient fluid to exhaust heat from the working fluid through the shell. In some embodiments, the immersion cooling system employs a two-phase working fluid that transitions between a liquid phase and a vapor phase to transfer heat from the heat-generating components to the ambient fluid. In some embodiments, the immersion cooling system employs a single-phase working fluid that remains in a single phase while transporting heat from the heat-generating components to the ambient fluid around the immersion cooling system.

The immersion cooling system may include a liquid working fluid that receives heat from one or more heat-generating components. The liquid working fluid absorbs the heat and does not change physical states as the liquid working fluid flows through an interior volume of the shell between manifolds. In some embodiments, a portion of the heat is transferred from the liquid working fluid to the shell, which, in turn, exhausts the heat to an exterior of the shell.

In some embodiments, a manifold directs the hot liquid working fluid into a first fluid conduit. The first fluid conduit carries the hot liquid working fluid to a heat exchanger positioned outside of the shell. The external heat exchanger is positioned in contact with the ambient fluid to exhaust heat into the ambient fluid and cool the liquid working fluid in the heat exchanger before returning the liquid working fluid through the second fluid conduit. In some embodiments, the second fluid conduit connects to another manifold that distributes the cooled liquid working fluid through the immersion chamber to evenly cool the heat-generating components.

The present disclosure relates to systems and methods for cooling heat-generating components of a computer or computing device according to at least the examples provided in the sections below:

(A1) In some embodiments, a liquid-submersible thermal management system includes a shell, a heat-generating component, a working fluid, and at least one heat-dispersing element. The shell defines an immersion chamber where the heat-generating component is located in the immersion chamber. The working fluid is positioned in the immersion chamber and at least partially surrounds the heat-generating component so the working fluid receives heat from the heat-generating component. The at least one heat-dispersing element is positioned on exterior surface of the shell to conduct heat from the shell into the heat-dispersing element.

(A2) In some embodiments, the liquid-submersible thermal management system of (A1) has a working fluid with a boiling temperature less than 90° C.

(A3) In some embodiments, the exterior surface of the shell of any preceding section is corrosion resistant.

(A4) In some embodiments, the exterior surface of the shell of any preceding section has a sacrificial anode thereon.

(A5) In some embodiments, the liquid phase of the working fluid of any preceding section completely fills the immersion chamber around the heat-generating component.

(A6) In some embodiments, an interior surface of the upper portion of the shell of any preceding section includes at least one interior surface feature thereon to receive heat from the working fluid.

(A7) In some embodiments, an interior surface of the upper portion of the shell of any preceding section includes a condensation texture to promote condensation of a vapor phase of the working fluid.

(A8) In some embodiments, the thermal management system of any preceding section includes an exterior pump to move an exterior fluid across the exterior surface.

(A9) In some embodiments, the heat-generating component of any preceding section is a server computer, and the thermal management system includes at least one networking component located below the server computer relative to an upper portion of the shell.

(A10) In some embodiments, the working fluid of (A1) includes a liquid phase of the working fluid configured to receive heat from the heat-generating component and a vapor phase of the working fluid positioned in a headspace of the immersion chamber.

(A11) In some embodiments, the shell of the thermal management system of any preceding section includes an inner wall and an outer wall, and further includes a shell conduit located between the inner wall and the outer wall.

(A12) In some embodiments, a thermal management system of (A10) or (A11) includes a nozzle configured to mist the liquid phase of the working fluid into the immersion chamber.

(A13) In some embodiments, the nozzle of (A12) provides the liquid phase in droplets less than 0.5 mm in diameter.

(A14) In some embodiments, the thermal management system of (A12) or (A13) includes a fluid conduit to subcool the liquid phase prior to passing through the nozzle.

(A15) In some embodiments, the shell of any preceding section has a first thickness of the shell proximate the upper portion that is less than a second thickness of the shell proximate a lower portion.

(A16) In some embodiments, the thermal management system of any preceding section has an interior pressure of the working fluid greater than 1.25 atmospheres.

(A17) In some embodiments, a liquid phase of the working fluid of (A1) completely fills the immersion chamber to surround the heat-generating component.

(A18) In some embodiments, a thermal management system of (A17) includes a heat exchanger, a first fluid conduit providing fluid communication between a hot fluid pickup at a first side of the immersion chamber and the heat exchanger, and a second fluid conduit providing fluid communication between the heat exchanger and a fluid return at a second side of the immersion chamber.

(A19) In some embodiments, the heat exchanger of (A18) is external to a shell.

(A20) In some embodiments, the heat exchanger of (A18) is a liquid-cooled heat exchanger.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A liquid-submersible thermal management system comprising:
   a shell defining an immersion chamber;
   a heat-generating electrical component located in the immersion chamber;
   a working fluid positioned in the immersion chamber and at least partially surrounding the heat-generating component, the working fluid configured to receive heat from the heat-generating component; and at least one heat-dispersing element positioned on an exterior surface of the shell to conduct heat from the shell into the heat-dispersing element.

2. The liquid-submersible thermal management system of claim 1, wherein the working fluid has a boiling temperature less than 90° C.

3. The liquid-submersible thermal management system of claim 1, wherein the exterior surface of the shell is corrosion resistant.

4. The liquid-submersible thermal management system of claim 1, further comprising a sacrificial anode on the exterior surface of the shell.

5. The liquid-submersible thermal management system of claim 1, wherein a liquid phase of the working fluid completely fills the immersion chamber around the heat-generating electrical component.

6. The liquid-submersible thermal management system of claim 1, wherein an interior surface of an upper portion of the shell includes at least one interior surface feature thereon to receive heat from the working fluid.

7. The liquid-submersible thermal management system of claim 1, wherein an interior surface of an upper portion of the shell includes a condensation texture to promote condensation of a vapor phase of the working fluid.

8. The liquid-submersible thermal management system of claim 1, further comprising an exterior pump to move an exterior fluid across the exterior surface.

9. The thermal management system of claim 1, wherein the heat-generating component is a server computer, and further comprising at least one networking component located below the server computer relative to an upper portion of the shell.

10. A liquid-submersible thermal management system comprising:
   a shell defining an immersion chamber;
   a heat-generating component located in the immersion chamber;
   a working fluid positioned in the immersion chamber and at least partially surrounding the heat-generating component, a liquid phase of the working fluid configured to receive heat from the heat-generating component and a vapor phase of the working fluid positioned in a headspace of the immersion chamber; and
   at least one heat-dispersing element positioned on an exterior surface of an upper portion of the shell to conduct heat from the shell into the heat-dispersing element.

11. The liquid-submersible thermal management system of claim 10, wherein the shell includes an inner wall and an outer wall, and further comprising a shell conduit located between the inner wall and the outer wall.

12. The liquid-submersible thermal management system of claim 10, further comprising a nozzle configured to mist the liquid phase of the working fluid into the immersion chamber.

13. The liquid-submersible thermal management system of claim 12, wherein the nozzle provides the liquid phase in droplets less than 0.5 mm in diameter.

14. The liquid-submersible thermal management system of claim 12, further comprising a fluid conduit to subcool the liquid phase prior to passing through the nozzle.

15. The liquid-submersible thermal management system of claim 10, wherein a first thickness of the shell proximate the upper portion is less than a second thickness of the shell proximate a lower portion.

16. The liquid-submersible thermal management system of claim 10, wherein an interior pressure of the working fluid is greater than 1.25 atmospheres.

17. A liquid-submersible thermal management system comprising:
   a shell defining an immersion chamber;
   a heat-generating component located in the immersion chamber;
   a working fluid positioned in the immersion chamber and completely filling the immersion chamber to surround the heat-generating component, the working fluid configured to receive heat from the heat-generating component; and
   at least one heat-dispersing element positioned on an exterior surface of the shell to conduct heat from the shell into the heat-dispersing element.

18. The liquid-submersible thermal management system of claim 17, further comprising:
   a heat exchanger;
   a first fluid conduit providing fluid communication between a hot fluid pickup at a first side of the immersion chamber and the heat exchanger; and
   a second fluid conduit providing fluid communication between the heat exchanger and a fluid return at a second side of the immersion chamber.

19. The liquid-submersible thermal management system of claim 18, wherein the heat exchanger is external to the shell.

20. The liquid-submersible thermal management system of claim 18, wherein the heat exchanger is a liquid-cooled heat exchanger.

* * * * *